US007326437B2

(12) United States Patent
Nguyen

(10) Patent No.: US 7,326,437 B2
(45) Date of Patent: Feb. 5, 2008

(54) METHOD AND SYSTEM FOR COATING POLYMER SOLUTION ON A SUBSTRATE IN A SOLVENT SATURATED CHAMBER

(75) Inventor: Andrew Nguyen, San Jose, CA (US)

(73) Assignee: ASML Holding N.V., Veldhoven (NL)

( * ) Notice: Subject to any disclaimer, the term of this patent is extended or adjusted under 35 U.S.C. 154(b) by 312 days.

(21) Appl. No.: 10/748,457

(22) Filed: Dec. 29, 2003

(65) Prior Publication Data

US 2005/0147748 A1    Jul. 7, 2005

(51) Int. Cl.
*B05D 3/12* (2006.01)
*B05D 3/04* (2006.01)

(52) U.S. Cl. ............ 427/240; 427/335; 427/377; 427/425; 118/52; 118/64; 118/320; 118/326; 438/758

(58) Field of Classification Search ............ 427/240, 427/425, 335, 377; 118/52, 320, 326, 64; 438/758
See application file for complete search history.

(56) References Cited

U.S. PATENT DOCUMENTS

| 5,143,552 | A |   | 9/1992 | Moriyama |
| 5,472,502 | A |   | 12/1995 | Batchelder et al. |
| 5,611,886 | A | * | 3/1997 | Bachman et al. ...... 156/345.23 |
| 5,658,615 | A | * | 8/1997 | Hasebe et al. .............. 427/240 |
| 5,670,210 | A |   | 9/1997 | Mandal et al. |
| 5,954,878 | A |   | 9/1999 | Mandal et al. |
| 6,027,760 | A | * | 2/2000 | Gurer et al. ............... 427/8 |
| 6,177,133 | B1 |   | 1/2001 | Gurer et al. |
| 6,228,561 | B1 | * | 5/2001 | Hasebe et al. .............. 430/311 |
| 6,238,735 | B1 |   | 5/2001 | Mandal et al. |
| 6,248,398 | B1 | * | 6/2001 | Talieh et al. .............. 427/240 |

(Continued)

FOREIGN PATENT DOCUMENTS

| EP |       0 595 749 A2 | 5/1994 |
| WO | WO 02/071153 A2 | 9/2002 |
| WO | WO 02/071154 A2 | 9/2002 |

OTHER PUBLICATIONS

PCT Int'l. Search Report, Intl. Application No. PCT/US2004/041203, filing date Dec. 10, 2004, date of mailing Sep. 22, 2005, (8 pages).

(Continued)

*Primary Examiner*—Kirsten Jolley
(74) *Attorney, Agent, or Firm*—Blakely, Sokoloff, Taylor & Zafman LLP

(57) ABSTRACT

A method and apparatus of coating a polymer solution on a substrate such as a semiconductor wafer. The apparatus includes a coating chamber having a rotatable chuck to support a substrate to be coated with a polymer solution. A dispenser to dispense the polymer solution over the substrate extends into the coating chamber. A vapor distributor having a solvent vapor generator communicable with the coating chamber is included to cause a solvent to be transformed into a solvent vapor. A carrier gas is mixed with the solvent vapor to form a carrier-solvent vapor mixture. The carrier-solvent vapor mixture is flown into the coating chamber to saturate the coating chamber. A solvent remover communicable with the coating chamber is included to remove excess solvent that does not get transformed into the solvent vapor to prevent the excess solvent from dropping on the substrate.

32 Claims, 4 Drawing Sheets

U.S. PATENT DOCUMENTS

| | | |
|---|---|---|
| 6,261,007 B1 | 7/2001 | Takamori et al. |
| 6,317,642 B1 | 11/2001 | You et al. |
| 6,327,793 B1 | 12/2001 | Gurer et al. |
| 6,548,115 B1 | 4/2003 | Gibson et al. |
| 2001/0033895 A1 | 10/2001 | Minami et al. |
| 2002/0176936 A1 | 11/2002 | Matsuyama |
| 2003/0003760 A1 | 1/2003 | Kim et al. |
| 2003/0152875 A1 | 8/2003 | Morales et al. |

OTHER PUBLICATIONS

International Preliminary Report on Patentability and Written Opinion of the International Searching Authority for International Application No.: PCT/US2004/041203, mailed Jul. 13, 2006.

* cited by examiner

METHOD AND SYSTEM FOR COATING POLYMER SOLUTION ON A SUBSTRATE IN A SOLVENT SATURATED CHAMBER

BACKGROUND

1. Field

Aspects of this disclosure pertain to a method and system of coating a polymer solution such as a photoresist polymer solution over a surface of a substrate such as silicon substrate. The coating occurs in a solvent saturated chamber to prevent evaporation of the polymer solution during coating.

2. Discussion of Related Art

The manufacture of integrated circuits involves the transfer of geometric shapes on a mask to the surface of a semiconductor wafer. Thereafter the semiconductor wafer corresponding to the geometric shapes or corresponding to the areas between the geometric shapes is etched away. The transfer of the shapes from the mask to the semiconductor wafer typically involves a lithographic process. This includes applying a photosensitive pre-polymer solution to the semiconductor wafer. The solvent in the pre-polymer solution is removed by evaporation, and the resulting polymer film is then baked. The film is exposed to radiation, for example ultraviolet light, through a photomask supporting the desired geometric patterns. The images in the photosensitive material are then developed by soaking the wafer in a developing solution. The exposed or unexposed areas are removed in the developing process, depending on the nature of the photosensitive material. Thereafter the wafer is placed in an etching solution which etches away the areas not protected by the photosensitive material. Due to their resistance to the etching process, the photosensitive materials are also known as photoresist. These may for instance be sensitive to ultraviolet light, electron beams, x-rays, or ion beams.

The high cost of the photoresist pre-polymer solutions makes it desirable to devise methods of improving the efficiency of the coating process so as to minimize the amount of the polymer solution required to coat a substrate. Furthermore, thickness uniformity of the photoresist layer is an important criterion in the manufacture of integrated circuits. It ensures satisfactory reproduction of the geometric patterns on the semiconductor wafer. The solvent in the photoresist tends to evaporate during application, increasing the viscosity of the polymer solution and inhibiting the leveling of the resulting film. This produces thickness non-uniformities. It is therefore desirable to be able to control the rate of evaporation of solvent from the polymer solution during the coating process.

BRIEF DESCRIPTION OF THE DRAWINGS

The disclosure is illustrated by way of embodiments and not by way of limitation in the figures of the accompanying drawings in which like references indicate similar elements. The invention may best be understood by referring to the following description and accompanying drawings that are used to illustrate embodiments of the invention. In the drawings.

The features of the described embodiments are specifically set forth in the appended claims. The embodiments are best understood by referring to the following description and accompanying drawings, in which similar parts are identified by like reference numerals.

SUMMARY

Figure 1:
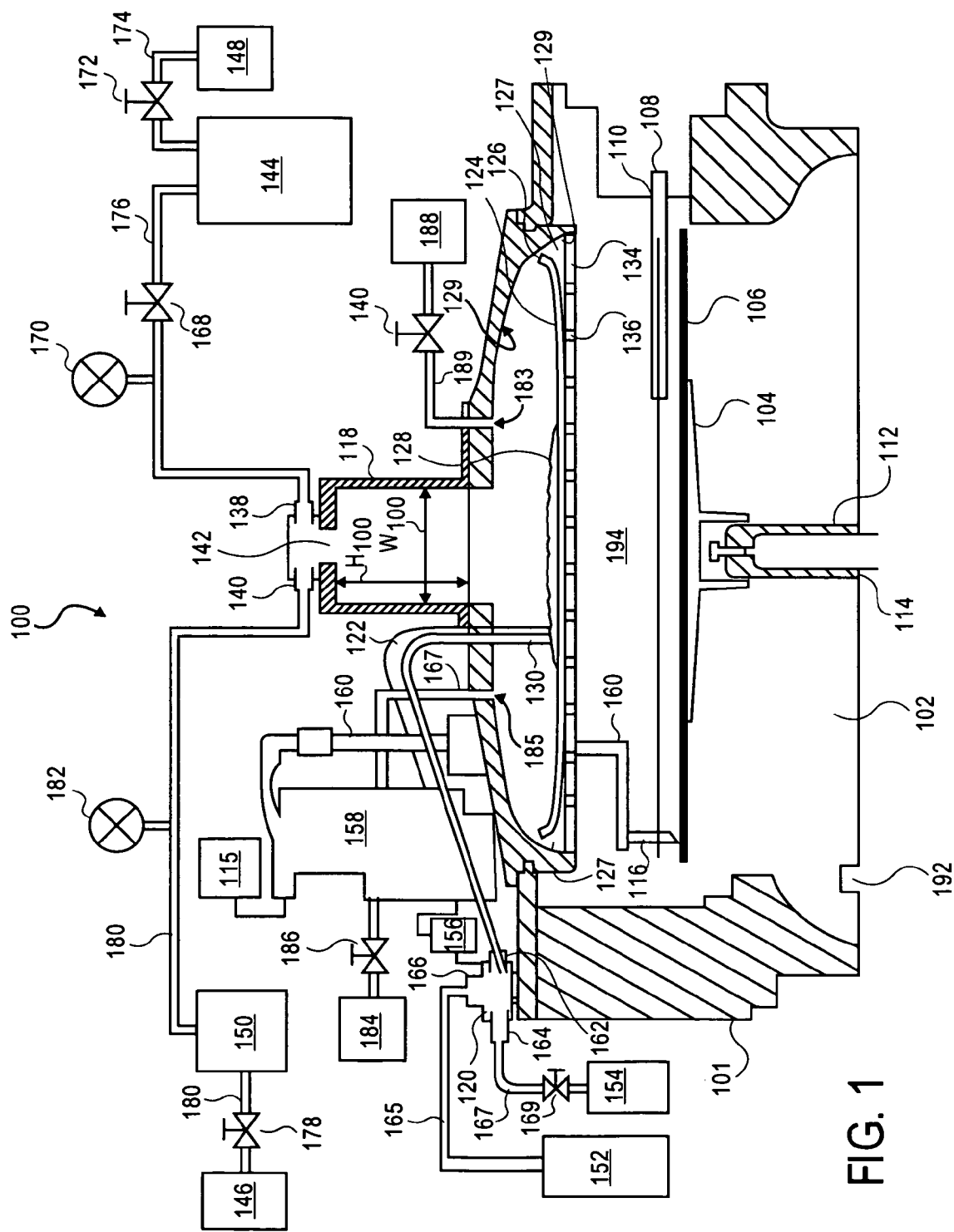
FIG. 1 illustrates an exemplary embodiment of a coating apparatus.

In one aspect of the invention, an embodiment includes an apparatus of coating a polymer solution on a substrate such as a semiconductor wafer. The apparatus includes a coating chamber having a rotatable chuck to support a substrate to be coated with a polymer solution. A dispenser to dispense the polymer solution over the substrate extends into the coating chamber. A vapor distributor having a solvent vapor generator communicable with the coating chamber is included to cause a solvent to be transformed into a solvent vapor. A carrier gas is mixed with the solvent vapor to form a carrier-solvent vapor mixture. The carrier-solvent vapor mixture is flown into the coating chamber to saturate the coating chamber. A solvent remover communicable with the coating chamber is included to remove excess solvent that does not get transformed into the solvent vapor to prevent the excess solvent from dropping on the substrate.

In another aspect of the invention, an embodiment includes a method of coating a polymer solution over a surface of a substrate. The method includes securing a substrate to be coated with a polymer solution in a coating chamber having a rotatable chuck that supports the substrate. The method further includes generating a carrier-solvent vapor mixture and saturating the coating chamber with the carrier-solvent vapor mixture, wherein a carrier gas is mixed with the solvent vapor to form the carrier-solvent vapor mixture. Excess solvent that does not get transformed into solvent vapor is removed to prevent the excess solvent from dropping on the substrate. The polymer solution is dispensed over a surface of the substrate while the coating chamber is saturated with the carrier-solvent vapor mixture. The substrate is rotated to spread the polymer solution over the surface of the substrate.

DETAILED DESCRIPTION

Exemplary embodiments are described with reference to specific configurations and techniques. Those of ordinary skill in the art will appreciate the various changes and modifications to be made while remaining within the scope of the appended claims. Additionally, well known elements are not set forth in detail in order to not obscure the substance of the embodiments of the present invention. The following description and drawings are illustrative of the invention and are not to be construed as limiting the invention.

The embodiments of the present invention direct to an apparatus and method of coating a surface of a substrate such as a semiconductor wafer with a polymer solution such as a photoresist solution. In particular, the embodiments pertain to spin coating a surface of the substrate with the polymer solution in a volatile solvent saturated environment. The substrate can be a semiconductor wafer used in the manufacture of integrated circuits (e.g., monocrystalline silicon). The substrate can also include patterns and structures created on the substrate. The coating occurs in a coating chamber that is saturated with a solvent vapor such that when coating takes place, the evaporation of the polymer solution is minimized. Such a coating environment with volatile solvent saturation prevents polymer solution evaporation thus, improving the thickness uniformity of the polymer to be coated on the substrate. In addition, such coating environment reduces the amount of polymer solution needed to do the coating.

The embodiments will be described with more reference to semiconductor wafers used in the manufacture of integrated circuits and the application of photoresist solutions to a surface of a semiconductor wafer. It will be appreciated that films or coatings used in integrated circuit manufacture are not limited to photoresist layers and could, for example, include materials such as organic planarization films, anti-reflection films, siloxane spin-on-glass films, polyimide films, and polyimide siloxane films.

In one embodiment, a polymer solution such as a photoresist solution has a solute content ranging from about 10% to about 50% by weight. In one embodiment, the photoresist solution is a deep-ultraviolet photoresist polymer.

In one aspect, the coating occurs in a coating apparatus that has a coating chamber having a rotatable chuck that can secure and support a substrate to be coated. A dispenser to dispense a polymer solution over a surface of the substrate is extended into the coating chamber. A vapor distributor (e.g., an atomizer or an ultrasonic device) is configured and positioned such that it is communicable with the coating chamber. The vapor distributor includes a solvent vapor generator that can transform a solvent into a solvent vapor. A carrier gas is mixed with the solvent vapor to form a carrier-solvent vapor mixture. The carrier gas functions to carry the solvent vapor into the coating chamber. The carrier gas also functions to provide a "spray action" for delivering the solvent vapor into the coating chamber. The carrier-solvent vapor mixture is flown into the coating chamber via the solvent distributor to saturate the coating chamber. A solvent remover is configured to be communicable with the coating chamber to remove excess solvent that does not get transformed into the solvent vapor. This prevents excess solvent (or droplets of solvent) from dropping or dripping on the substrate and causing non-uniformity in the polymer solution and consequently, the non-uniformity in the polymer layer to be formed. The solvent remover can be an atomizer or an ultrasonic device configured to cause the excess solvent to be sucked out of the coating chamber. A carrier gas source and a solvent source are coupled to the vapor distributor to supply the carrier gas and the solvent to the vapor distributor. A polymer solution source is coupled to the dispenser to supply the polymer solution to the dispenser.

In some aspects, a fluid sensor is included in the coating chamber to detect the presence of the excess solvent so as to cause the solvent remover to activate and remove the excess solvent before the solvent drips down on the substrate.

In some other aspects, the coating chamber includes a collector placed above a coating area that is adjacent the substrate. The carrier-solvent vapor mixture passes to the collector prior to passing into the coating area. The collector has a raised edge that prevents excess solvent from spilling into the coating area. Only the carrier-solvent vapor mixture can float over the collector and into the coating area. A showerhead may be placed below the collector and above the coating area to act as a second screener for the carrier-solvent vapor mixture. The showerhead has a plurality of openings sized to allow acceptable mist or vapor to pass through (e.g., openings ranging from 0.010 µm to 0.085 µm). The carrier-solvent vapor mixture passes into the coating area through the openings. The showerhead also functions to uniformly distribute the carrier-solvent vapor mixture into the coating area. The description below discusses in more details a coating apparatus of the exemplary embodiments of the present invention.

FIG. 1 illustrates a coating apparatus 100 in accordance with exemplary embodiments of the present invention. The coating apparatus 100 includes a housing 101 that houses a coating chamber 102. A rotatable support chuck 104 is mounted in the coating chamber 102. The rotatable support chuck 104 supports a substrate 106, which in some embodiments, is a wafer or a silicon wafer. The substrate 106 may include structures or patterns formed thereon as is known in the art. The rotatable support chuck 104 passes through an opening 114 created at the bottom of the coating chamber 102. The rotatable support chuck 104 is mounted on an axel 112 which can spin or rotate the rotatable support chuck 104.

The housing 101 includes a substrate transport door 110 to allow for the transporting the substrate 106 in and out of the coating chamber 102. A robotic device 108 that includes a substrate handler can be used to move the substrate 106 in and out of the transport door 110. The transport door 110 is shut after the substrate 106 is placed or secured on the chuck 104. The transport door 110 is also shut during the coating process.

A dispenser 116 is extended into the coating chamber 102. The dispenser 116 is coupled to a dispensing line 160 that is communicable with a polymer solution source 158. The dispenser 116 dispenses the polymer solution on a surface of the substrate 106 for coating. In one embodiment, the dispenser 116 rests on the side of the substrate 116 and moves toward the center of the substrate 116 for coating. The dispenser 116 is configured to dispense the polymer solution at a controlled rate over the substrate 106. In one embodiment, a controller 115 is coupled to the polymer solution source 158, the dispensing line 160, and/or the dispenser 116 to control the volume and rate to dispense the polymer solution on the substrate 106. The controller 115 can also be configured to control the dispenser 116 so that the dispenser 116 can move into and out of the coating position (e.g., center or side of the substrate 116).

A vapor distributor 118 is included in the coating apparatus 100. The vapor distributor 118 is communicable with the coating chamber 102. In one embodiment, the vapor distributor 118 is placed on top of the housing 101 and above the coating chamber 102. The vapor distributor 118 vaporizes, transfers, or converts a solvent into a solvent vapor and mixes the solvent vapor with a carrier (e.g., nitrogen ($N_2$)) gas to form a carrier-solvent vapor mixture. The solvent should be similar or compatible to the solvent of the polymer solution to be dispensed. In one embodiment, the solvent is one typically used in a photoresist solution, typically used in semiconductor processing. The vapor distributor 118 also passes or injects the carrier-solvent vapor mixture into the coating chamber to saturate the coating chamber 102 with the carrier-solvent vapor mixture. Saturating the coating chamber 102 helps controlling the atmosphere above the substrate 106 surface and control the rate of solvent evaporation from the polymer solution coating. In one embodiment, the vapor distributor 118 includes a solvent vapor generator that functions to transform the solvent into the solvent vapor. In one embodiment, the vapor distributor 118 is an atomizer and in another embodiment, the vapor distributor 118 is an ultrasonic device that can vaporize the solvent.

In one embodiment, the vapor distributor 118 includes a first conduit 138, a second conduit 140, and a third conduit 142. The vapor distributor 118 can be an atomizer that is readily and commercially available. The first conduit 138 communicates to a solvent source 144, which supplies the solvent to the vapor distributor 118. The solvent source 144 is hooked up to a line 176 that leads into the conduit 138. The solvent source 144 can be a pressurized canister (e.g., at approximately 10 psi) so that once open, the solvent can be supplied to the vapor distributor 118. In one embodiment, the solvent source 144 is coupled to a pressure source 148 (e.g. an inert gas such as $N_2$ gas) through a line 174. The pressure source 148 can cause the transfer of the solvent to the vapor distributor 118 by supplying a sufficient and small amount of inert gas to the solvent source 144. In one embodiment, $N_2$ gas is flown into the solvent source to cause the solvent to be transferred to the vapor distributor 118. Valves 172 and 168 are provided to allow for the flow of the solvent into the vapor distributor 118. A flow controller 170 can also be provided to control the flow rate of the solvent into the vapor distributor 118.

A carrier gas source 146 is coupled to the vapor distributor 118 to supply the carrier gas into the vapor distributor 118. The carrier gas source 146 is communicable to the vapor distributor 118 through line 180, which ends into the second conduit 140 of the vapor distributor 118. The carrier gas source 116 includes a valve 178 that once opened, allows for the flow of the carrier gas into the vapor distributor 118. A controller 150 may be coupled to the carrier gas source 146 to allow for the control of the flow of the carrier gas to the vapor distributor 118. In addition, the controller 150 may control other parameter for the carrier gas flowing from the carrier gas source 146. In one embodiment, the controller 150 controls the temperature of the carrier gas to be supplied to the vapor distributor 118. In one embodiment, the controller 150 maintains the carrier gas at a temperature between 18-30° C. as the carrier gas is being supplied to the vapor distributor 118. A flow meter or a flow control 182 can also be coupled to the carrier gas source 146 to allow for the monitoring of the flow rate of the carrier gas.

In one embodiment, the vapor distributor 118 has a height H100 and a width W100 which make up the space in the vapor distributor 118 where the solvent is vaporized and mixed with the carrier gas. The height H100 ranges from 4-12 inches and in one embodiment, is about 4.5 inches. The height H100 should be sufficient for the solvent to vaporize and mix with the carrier gas. Too short of a height H100 may cause more excess solvent to pass into the coating chamber 102 due insufficient mixing and vaporizing space. The width W100 is configured to be sufficient for the desired angle of the spray of the carrier-solvent vapor mixture. In one embodiment the carrier-solvent vapor mixture has a spray angle between about 15-35 degrees. The width W100 should be sufficiently wide to accommodate the spray angle of the carrier-solvent vapor mixture so that the mixture can easily be released into the coating chamber 102 without obstruction. In one embodiment, the width W100 is about 3.5-6.0 inches.

In one embodiment, a collector 124 is provided within the coating chamber 102. The collector 124 is placed as closed to the vapor distributor 118 as possible. In one embodiment, the collector 124 is placed at about 4.5 to 5.5 inches below the vapor distributor 118. The collector 124 is positioned within the coating chamber 102 such that gaps 127 are created between the collector 124 and an inner wall 129 of the coating chamber 102. The gaps 127 allow the carrier-solvent vapor mixture to flow from the collector 124 into a coating area 194. In one embodiment, the circumference of the collector 124 is less than an inner area 129 of the coating chamber by the gaps 127.

The coating area 194 is defined as the area within the coating chamber 102 that is adjacent the substrate 106 or the chuck 104. In one embodiment, only the coating area 194 needs to be saturated with the carrier-solvent vapor mixtures to prevent evaporation of the solvent in the polymer solution during coating.

Figure 3:
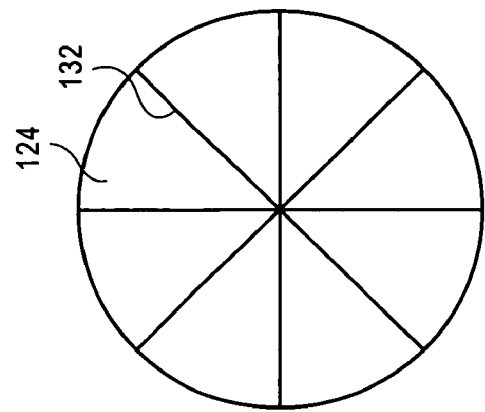
FIG. 3 illustrates a top view of a collector provided within the coating apparatus shown in FIG. 1.
Figure 4:
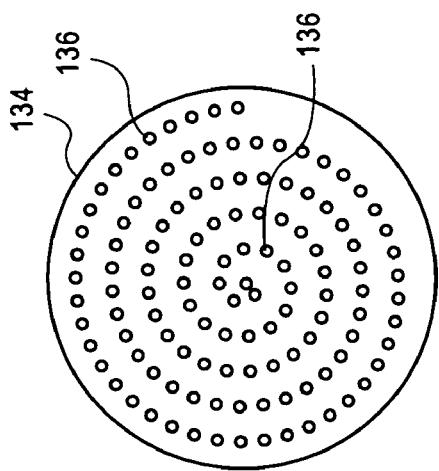
FIG. 4 illustrates a top view of a showerhead provided within the coating apparatus shown in FIG. 1.

FIG. 3 illustrates the top view of the collector 124. The collector 124 can be seen as the first stop for the carrier-solvent vapor mixture. After being ejected from the vapor distributor 118, the carrier-solvent vapor mixture meets or passes to the collector 124. In one embodiment, the collector 124 is essentially a round disc having a concentric center and a plurality of grooves 132 (FIG. 3). Not all of the solvent coming from the vapor distributor may have been converted into the solvent vapor. There may still be droplets of the solvent 128 that get passed into the coating chamber 102. Preventing the solvent droplets from dripping or falling on the substrate 106 is important to control the uniformity of the polymer solution concentration as well as the polymer layer to be formed on the substrate. The collector 124 functions to stop any excess solvent 128 that is not transformed, vaporized, or converted into the solvent vapor from entering a coating area 194 of the coating chamber 102. The collector 124 does not include openings that the excess solvent may pass though to enter the coating area 194. The grooves 132 in the collector 124 help to direct the excess solvent 128 toward the center of the collector 124. The collector 124 also includes a raised edge 126 (FIGS. 1 and 2) to prevent the excess solvent 128 from spilling over the collector 124 and into the coating area 194.

In one embodiment, a showerhead 134 is provided within the coating chamber 102. The showerhead 134 is placed immediately below the collector 124. In one embodiment, the showerhead 134 is placed about 0.3 to 0.7 inches below the collector 124. The showerhead 134 receives the carrier-solvent vapor mixture that is passed down from the collector 124 through the gaps 127. The showerhead 134 includes a plurality of openings 136 (FIGS. 1 and 2) sized to allow the carrier-solvent vapor mixture to pass through and saturate the coating area 194 below. In one embodiment, the openings 136 have sizes ranging from 0.010 µm to 0.085 µm. The openings 136 are sized to optimize the flow rate of the carrier-solvent vapor mixture. The smaller the openings 136, the longer it may take to saturate the coating area. On the other hand, openings 136 that are too large may allow unnecessary contamination. In one embodiment, the openings 136 have sizes ranging from 0.030 µm to 0.080 µm. The openings 136 are distributed relatively evenly over the showerhead to cover a wide area of the coating area.

In one embodiment, a solvent remover 120 is included with the coating apparatus 100. The solvent remover 120 can be an atomizer or an ultrasonic device. The solvent remover 120 is similar to the vapor distributor in that the solvent remover 120 includes a vapor generator to takes the excess solvent 128 and converts the excess solvent 128 into a solvent vapor that can be removed from the coating chamber 102 or the collector 124.

In one embodiment, the solvent remover 120 is coupled to the housing 101 as shown in FIG. 1. The housing 101 includes an opening for a solvent removal line 130 to be extended there through. The solvent removal line 130 communicates with the solvent remover 120 to transfer the excess solvent 128 to the solvent remover 120. The solvent remover 120 includes a first conduit 162 where the solvent removal line 130 ends into. In one embodiment, a carrier gas (e.g., N$_2$ gas) or a clean dry air 154 is used to supply into the solvent remover 120 to cause the excess solvent 128 to be sucked into the solvent remover 120 and vaporized. The carrier gas can enter the solvent remover 120 from a carrier gas source 154, through a line 167, and a second conduit 164. A valve 169 can also be included with the carrier gas source 154 to control the flow of the carrier gas into the solvent remover 120. The carrier gas or the clean dry air 154 is mixed with the excess solvent 128 removed through the solvent removal line 130 and vaporized in the solvent remover 120. The excess solvent 128 can then be removed to a container 152 through a third conduit 166 of the solvent remover 120. The removed excess solvent can be recycled or removed into the container 162 through a line 165 that extends from the third conduit 166 to the container 162.

In one embodiment, a fluid sensor 122 is placed in proximity with the collector 124. The fluid sensor 122 is configured to detect the solvent level or the presence of solvent collected at the collector 124. The fluid sensor 122 can be coupled with a sensor controller 156 which can be in communication with the solvent remover 120 to cause the removal of the excess solvent 128 when the fluid sensor 122 indicates a certain amount of excess solvent 128 is present on the collector 124.

In one embodiment, the coating chamber 102 includes openings 183 and 185 to allow for purging of the coating chamber 102. In one embodiment, an inert gas or clean dry air is used to purge the coating chamber 102. A purge line 187 extends into the opening 185 of the coating chamber 102 to allow for an inert gas (e.g., N$_2$) 184 to be flown into and purge the coating chamber 102. A valve 186 may also be included to control the flow of the inert gas into the coating chamber 102. In addition, a purge line 189 extends into the opening 183 of the coating chamber 102 to allow for an inert gas (e.g., N$_2$) 188 to be flown into and purge the coating chamber 102. A valve 190 may also be included to control the flow of the inert gas into the coating chamber 102. Each of the purge lines 187 and 189 may be coupled to a flow controller (not shown) to monitor the flow of the inert gas into the coating chamber 102 for the purging. Additionally, the coating chamber 102 includes an exhaust outlet 192 placed proximately at the bottom of the coating chamber 102 to allow for the exhausting and cleaning of the coating chamber 102.

Figure 2:
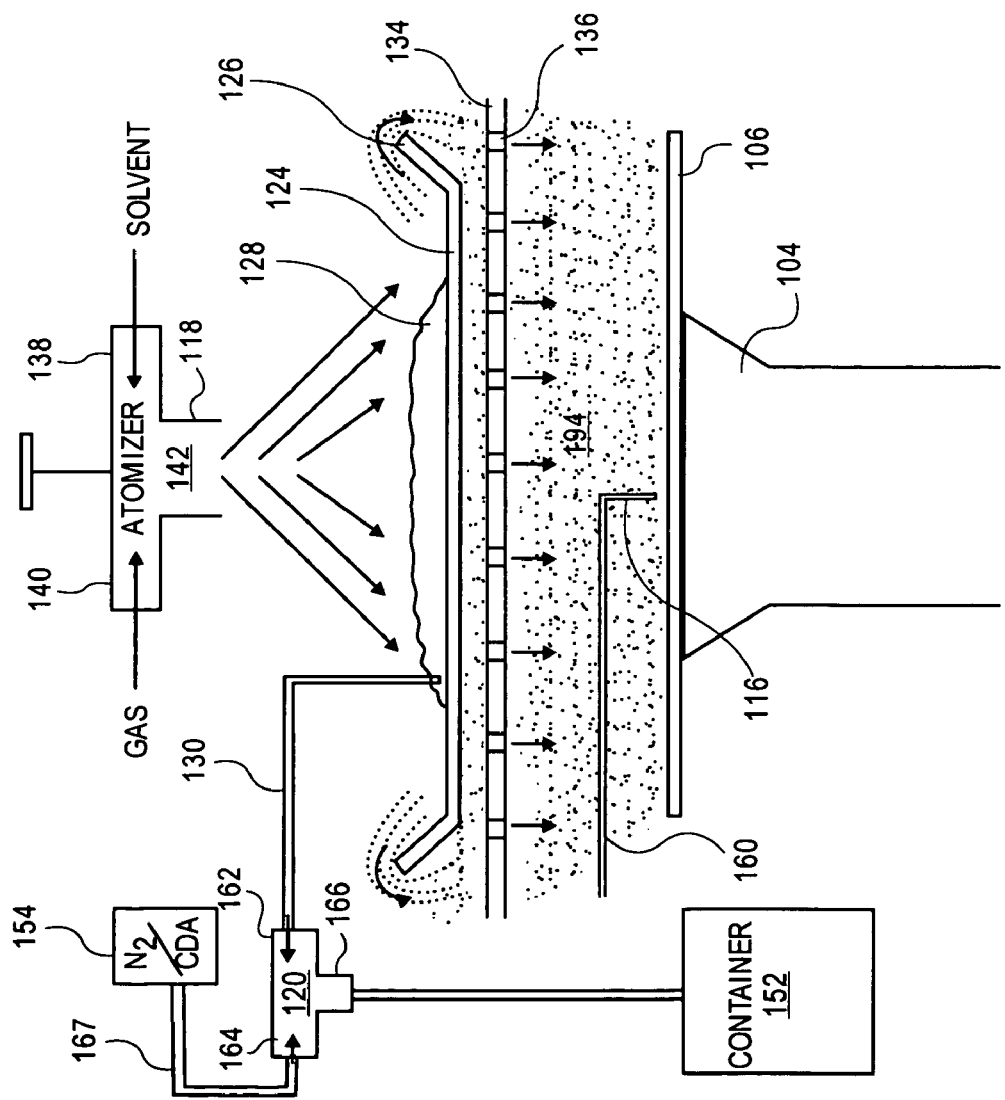
FIG. 2 illustrates a cross-sectional side view of a collector and showerhead provided within the coating apparatus shown in FIG. 1.

FIG. 2 illustrates in details the configuration of the vapor distributor 118, the collector 124, the showerhead 134, and the solvent remover 161. In one embodiment, the vapor distributor 118 is an atomizer that can vaporize the solvent that enters the first conduit 138 into a solvent vapor. Such an atomizer is known in the art. The vapor distributor 118 also mixes the solvent vapor with a carrier gas, such as nitrogen, that enters the second conduit 140 to create a carrier-solvent vapor mixture. The carrier-solvent vapor mixture is ejected out of the vapor distributor at the third conduit 142 at a particular spray angle (e.g., 15-35 degrees) as illustrated in FIG. 2.

As the carrier-solvent vapor mixture is ejected, some solvent may not have been vaporized and got ejected from the third conduit 142 as excess solvent 128. The excess solvent 128 is collected at the collector 124 and removed from the collector 124 through the solvent removal line 130 as shown in FIG. 2. In one embodiment, the solvent remover 120 is an atomizer. To remove the excess solvent, the carrier gas source 154 (e.g., N$_2$ gas source or clean dry air) is introduced to the solvent remover 161, which causes the excess solvent 128 to be moved into the solvent removal line and into the solvent remover 161. The excess solvent 128 is vaporized and carried out of the coating chamber with the carrier gas into the container 152. The excess solvent 128 can also be recycled for coating other substrates. The carrier-solvent vapor mixture, in it volatile state, easily floats over the edge 126 of the collector 124 and passes down to the showerhead 134. The carrier-solvent vapor mixture passes through the plurality of openings 136 as shown in FIG. 2 and saturate the coating area 194 that is adjacent the substrate 106. After the coating area 194 is saturated with the carrier-solvent vapor mixture, the dispenser 116 can dispense the polymer solution (e.g., photoresist solution) over the substrate 106 that is secured to the support chuck 104.

In one embodiment, an ultrasonic device is included in the vapor distributor 118 to vaporize the solvent. Typically, an ultrasonic device can vaporize a liquid into a finer mist than an atomizer or other similar devices can. An ultrasonic device can vaporize the solvent into a solvent vapor having a mist with droplets ranging from 10-20 μm. Using the ultrasonic device may eliminate the need for the solvent remover 120 to remove the excess solvent since the size of the solvent droplets will be significantly finer or smaller. Thus, in embodiment, the coating apparatus 100 includes an ultrasonic device to transform the solvent into the solvent vapor and the coating apparatus 100 does not include a solvent remover 120.

Figure 5:
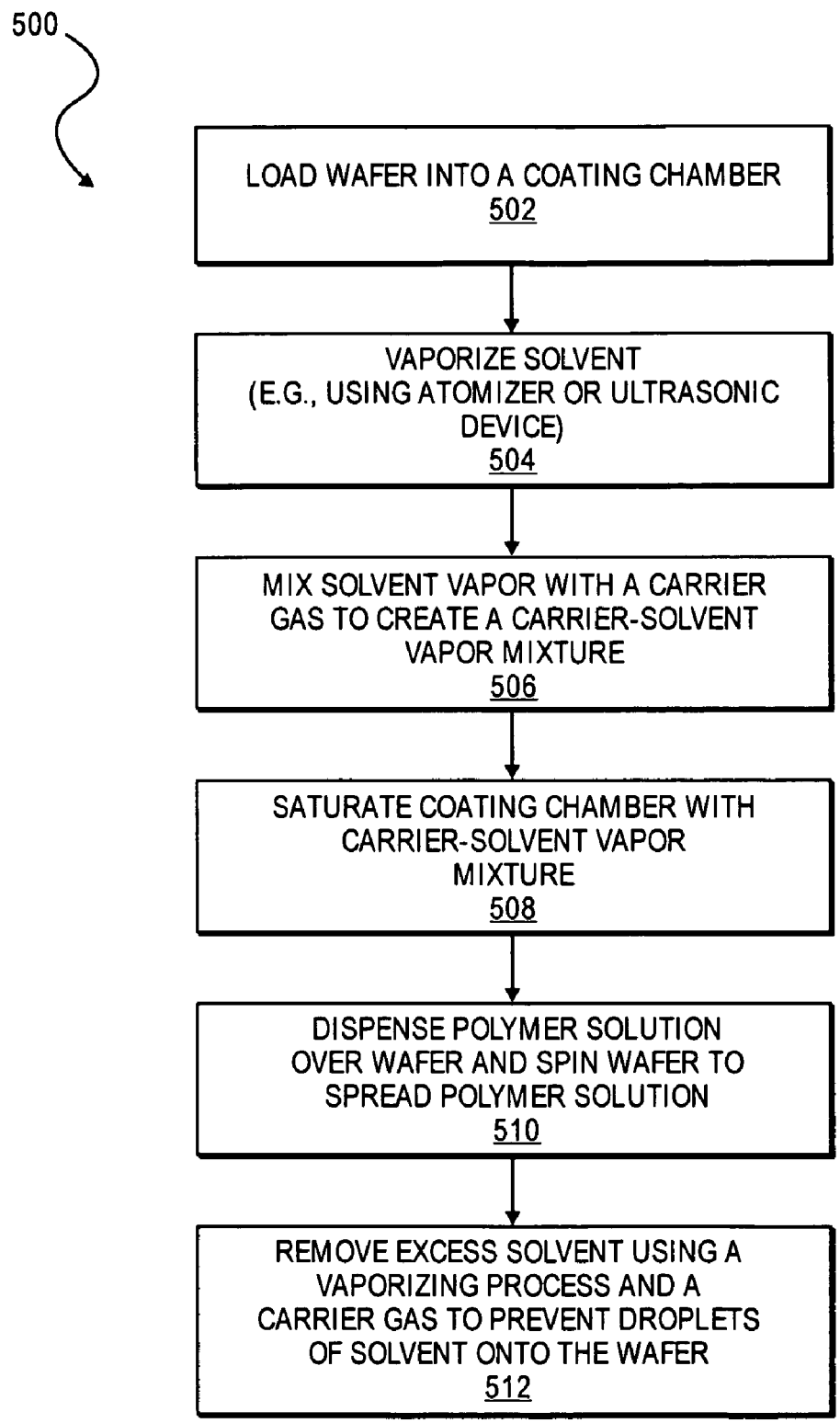
FIG. 5 illustrates an exemplary method of coating a polymer solution on a surface of a substrate.

FIG. 5 illustrates an exemplary method 500 of coating a substrate such as a wafer in a solvent saturated environment. At box 502, a wafer is loaded into the coating chamber such as the coating chamber 102 of the coating apparatus 100 previously described. The wafer is secured to a rotatable support chuck provided within the coating chamber. The wafer can be secured to the support chuck using conventional technique such as vacuum suction.

At box 504, a solvent is vaporized using for example, an atomizer or an ultrasonic device. The vaporized solvent is referred to as a solvent vapor. In one embodiment, the solvent is a solvent used in a photoresist solution. The solvent should be of similar composition as the solvent of the polymer solution or compatible to the polymer solution that is used to coat the substrate. In one embodiment, the solvent is vaporized in the solvent distributor as previously described. In one embodiment, the solvent is introduced into the solvent distributor at a rate of about 0.3 mL/sec to about 3.5 mL/sec for the vaporization. In another embodiment, the solvent is introduced into the solvent distributor at a rate of about 0.4 mL/sec for the vaporization.

At box 506, the solvent vapor is mixed with a carrier gas to create a carrier-solvent vapor mixture. The carrier gas helps aspirate the solvent vapor into the coating chamber. The carrier gas is introduced into the vapor distributor (e.g., the atomizer or the ultrasonic device) where it is mixed with the solvent vapor. In one embodiment, the carrier gas is introduced at a rate of about 15-25 L/min (or 250 mL/sec to 420 mL/sec). In another embodiment, the carrier gas is introduced at a rate of about 22.5 L/min (or 375 mL/sec).

At box 508, the carrier-solvent vapor mixture is introduced into the coating chamber to saturate the coating chamber with the carrier-solvent vapor mixture. In one embodiment, the carrier-solvent vapor mixture only saturates the coating area above the substrate. In one embodiment, the carrier-solvent vapor mixture is allowed to saturate the coating chamber for about 5-10 seconds. The duration it takes to saturate the coating chamber may depend on the volume of the coating chamber or the coating area. The duration can also depend on the size of the openings in the showerhead.

At box 510, with the coating chamber saturated with the carrier-solvent vapor mixture, a polymer solution (e.g., photoresist solution) is dispensed over a surface of the wafer. In one embodiment, the polymer solution has a temperature of about 21-25° C. In one embodiment, the polymer solution is dispensed approximately in the middle of the wafer. The wafer is spun or rotated to spread the polymer solution over the surface of the wafer. In one embodiment, the wafer is rotated at a speed of about 1000-2000 rmp to spread the polymer solution. The speed of the rotation may be varied depending on the desired thickness for the polymer film to be formed.

As the solvent is vaporized and introduced into the coating chamber some excess solvent may have been formed or remained. The excess solvent is the solvent that did not get vaporized. A fluid sensor may be placed in the coating chamber to detect the presence of the excess solvent so as to initiate the removal process. At box 512, the excess solvent is removed using a vaporizing process to vaporize the excess solvent (for example, using an atomizer previously discussed). A carrier gas is used to help move the excess solvent out of the coating chamber. In one embodiment, the carrier gas is flown at a rate of about 10 L/min (or 167 mL/sec) into an atomizer to cause the excess solvent to be sucked into the atomizer. In another embodiment, the carrier gas is flown at a rate of about 8 L/min (or 133 mL/sec) to 12 L/min (or 200 mL/sec) into an atomizer to cause the excess solvent to be sucked into the atomizer. The excess solvent can be removed after a predetermined number of coatings (e.g., after coating 5-10 wafers), based on a schedule time, or when the sensor indicates the presence of the excess solvent. The excess solvent can be removed at the end of a particular coating or simultaneously during a particular coating. With the excess solvent removed, the uniformity of the concentration of the polymer solution dispensed on the substrate as well the thickness of the polymer film to be formed are optimized. In addition, the concentration of the polymer solution is more controllable.

Figure 6:
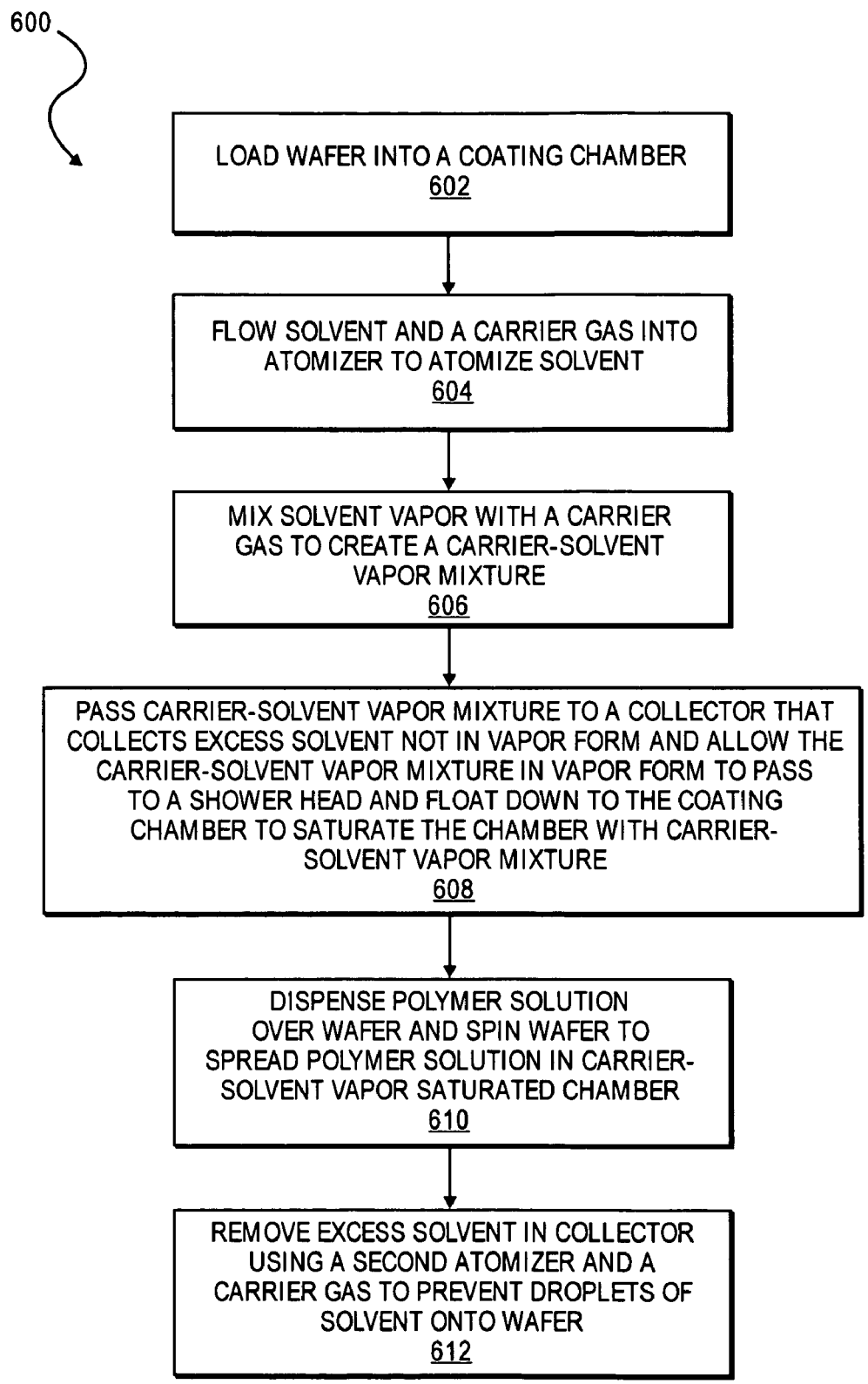
FIG. 6 illustrates another exemplary method of coating a polymer solution on a surface of a substrate.

FIG. 6 illustrates an exemplary method 600 of coating a substrate such as a wafer in a solvent saturated environment. At box 602, a wafer is loaded into the coating chamber such as the coating chamber 102 of the coating apparatus 100 previously described. The wafer is secured to a rotatable support chuck provided within the coating chamber. The wafer can be secured to the support chuck using conventional technique such as vacuum suction.

At box 604, a solvent is flown into a first atomizer to atomize or vaporize the solvent into a solvent vapor. In one embodiment, the solvent is a solvent used in a photoresist solution. The solvent should be of similar composition as the solvent of the polymer solution or compatible with the polymer solution that is used to coat the substrate. In one embodiment, the solvent is introduced into the atomizer at a rate of about 0.3 mL/sec to about 3.5 mL/sec for the evaporation. In another embodiment, the solvent is introduced into the atomizer at a rate of about 0.4 mL/sec for the evaporation.

At box 606, the solvent vapor is mixed with a carrier gas to create a carrier-solvent vapor mixture. The carrier gas helps aspirate the solvent vapor into the coating chamber. At box 608, the carrier-solvent vapor mixture is passed to a collector that collects excess solvent not in vapor form and allow the carrier-solvent vapor mixture in vapor form to pass to a shower head and float down to the coating chamber to saturate the chamber with the carrier-solvent vapor mixture. In one embodiment, the carrier-solvent vapor mixture is allowed to saturate the coating chamber for about 5-10 seconds. In one embodiment, the carrier-solvent vapor mixture only saturates the coating area above the substrate. The duration it takes to saturate the coating chamber may depend on the volume of the coating chamber or the coating area. The duration can also depend on the size of the openings in the showerhead.

At box 610, with the coating chamber saturated with the carrier-solvent vapor mixture, a polymer solution (e.g., photoresist solution) is dispensed over a surface of the wafer. In one embodiment, the polymer solution has a temperature of about 21-25° C. In one embodiment, the polymer solution is dispensed approximately in the middle of the wafer. The wafer is spun or rotated to spread the polymer solution over the surface of the wafer. In one embodiment, the wafer is rotated at a speed of about 1000-2000 rmp to spread the polymer solution. The speed of the rotation may be varied depending on the desired thickness for the polymer film to be formed.

The saturation of the carrier-solvent vapor mixture minimizes the evaporation of the polymer solution that is dispensed. Thus, less polymer solution is needed to coat the wafer. In addition, the saturation of the carrier-solvent vapor mixture allows for the wafer to be spun at a lower speed to achieve a certain thickness in the polymer film compared to where the coating environment is not saturated with solvent vapor.

As the solvent is vaporized and introduced into the coating chamber some excess solvent may have been formed or remained. The excess solvent is the solvent that did not get vaporized. A fluid sensor may be placed in the coating chamber to detect the presence of the excess solvent so as to initiate the removal process. At box 612, the excess solvent is removed using a vaporizing process using a second atomizer. The second atomizer vaporizes the excess solvent. A carrier gas is introduced into the second atomizer to cause the excess solvent to be transferred to the second atomizer. In one embodiment, the carrier gas is flown at a rate of about 10 L/min (or 167 mL/sec) into the second atomizer to cause the excess solvent to be sucked into the atomizer. In another embodiment, the carrier gas is flown at a rate of about 8 L/min (or 133 mL/sec) to 12 L/min (or 200 mL/sec) into the atomizer to cause the excess solvent to be sucked into the atomizer. The excess solvent can be removed after a predetermined number of coatings (e.g., after coating 5-10 wafers), based on a schedule time, or when the fluid sensor indicates the presence of the excess solvent. The excess solvent can be removed at the end of a particular coating or simultaneously during a particular coating. With the excess solvent removed, the uniformity of the concentration of the polymer solution dispensed on the substrate as well the thickness of the polymer film to be formed are optimized. In addition, the concentration of the polymer solution is more controllable.

In one embodiment, a controller (e.g., a processor or microprocessor operated on a computer) (not shown) is included in the coating system 10 to control the operation of the components of the system 100. For example, the controller may control the flow of the polymer solution, the functions of the pump 102, the dispensing valve 132, the enable valve 102, and the momentary valve 112. The controller may also control the shut down of the valve 104 when the sensor 126 indicates that the level in the polymer solution source 108 is insufficient for drawing or channeling polymer solution. The controller may also control the momentary valve 112, e.g., to keep the momentary valve 112 open for a predetermined amount of time (e.g., 1-7 seconds) to allow a flow of inert gas into the polymer solution source 108 to transfer the polymer solution into the buffer bank 106. The controller may also control the venting of the buffer tank 106, the temperature of the dispensing line 114, the dispensing valve 132, and the like of the coating system 100. The controller may be housed in a computer or similar machine. The controller may also be ran by a set of instructions programmed to carry out the coating and/or operation of the coating system 100.

Having disclosed exemplary embodiments, modifications and variations may be made to the disclosed embodiments while remaining within the spirit and scope of the invention as defined by the appended claims.

I claim:

1. A method for coating a surface of a substrate with a polymer solution comprising:
    securing a substrate to be coated with a polymer solution in a coating chamber having a rotatable chuck, the rotatable chuck to support the substrate;
    generating a carrier-solvent vapor mixture and saturating the coating chamber with the carrier-solvent vapor mixture, wherein a carrier gas is mixed with a solvent vapor to form the carrier-solvent vapor mixture;
    removing excess solvent liquid while processing substrates to be coated with a polymer solution, wherein the excess solvent liquid comprises solvent that did not get transformed into the solvent vapor from the region above the substrate within the chamber to form a reduced droplet carrier-solvent vapor mixture;
    injecting the reduced droplet carrier-solvent vapor mixture into the coating area region above the substrate, wherein the coating area region above the substrate is saturated with the reduced droplet carrier-solvent vapor mixture;
    dispensing the polymer solution over a surface of the substrate while the coating chamber is saturated with the carrier-solvent vapor mixture; and
    rotating the substrate to spread the polymer solution over the surface of the substrate; and
    wherein the removing of excess solvent liquid to form the reduced droplet carrier-solvent mixture helps prevent excess solvent liquid from dropping on the substrate.

2. The method of claim 1 comprising:
    detecting a solvent liquid level within the coating chamber with a fluid sensor while processing substrates to be coated with a polymer solution,
    the solvent liquid being excess solvent that did not get transformed into the solvent vapor; and then
    removing the excess solvent by vaporizing the excess solvent while processing substrates to be coated with a polymer solution.

3. The method of claim 1 comprising:
    flowing the carrier-solvent vapor mixture into a coating area using a showerhead having a plurality of openings, the showerhead being placed above the coating area within the coating chamber, wherein the carrier-solvent vapor mixture is flown into the coating area through the plurality of openings to saturate the coating area.

4. The method of claim 3, wherein the plurality of openings in the showerhead have sizes ranging from 0.010 µm to 0.085 µm.

5. The method of claim 1, wherein generating the carrier-solvent vapor mixture includes:
    introducing the solvent to be transformed into the solvent vapor into a first conduit of a vapor distributor, the vapor distributor including a solvent vapor generator to transform the solvent into the solvent vapor;
    introducing the carrier gas into a second conduit of the vapor distributor;
    vaporizing the solvent to create the solvent vapor;
    mixing the solvent vapor with the carrier gas to create the carrier-solvent vapor mixture; and
    introducing the carrier-solvent vapor mixture into the coating chamber to saturate the coating chamber.

6. The method of claim 5 further comprises coupling a solvent source and a carrier gas source to the vapor distributor.

7. The method of claim 1 further directing the excess solvent removed from the coating chamber into a container.

8. The method of claim 1 further comprises coupling a polymer solution source to the polymer dispenser extending into the coating chamber.

9. The method of claim 1, wherein removing the excess solvent that did not get transformed into the solvent vapor further comprises,
    introducing the carrier gas into a solvent remover to move the excess solvent into the solvent remover; and
    removing the excess solvent into a container.

10. The method of claim 1 further comprises evaporating solvent from the polymer solution dispensed on the surface of the substrate to form a polymer layer on the surface of the substrate.

11. The method of claim 10 wherein the polymer solution is a photoresist solution and the polymer layer is a photoresist film.

12. The method of claim 1 wherein generating the carrier solvent vapor mixture is done using one of an atomizer and an ultrasonic device.

13. The method of claim 1 wherein removing the excess solvent that did not get transformed into the solvent vapor is done using one of an atomizer and an ultrasonic device.

14. The method of claim 1, wherein the polymer solution forms a polymer layer comprising a film selected from the group consisting of: an organic planarization film, an anti-reflection film, a siloxane spin-on-glass film, a polyimide film, and a polyimide siloxane film.

15. A method for coating a surface of a substrate with a polymer solution comprising:
    securing a substrate to be coated with a polymer solution in a coating chamber having a rotatable chuck, the rotatable chuck to support the substrate;
    generating a carrier-solvent vapor mixture and saturating the coating chamber with the carrier-solvent vapor mixture, wherein a carrier gas is mixed with a solvent vapor to form the carrier-solvent vapor mixture;
    collecting the excess solvent that did not get transformed into the solvent vapor in a collector above a coating area within the coating chamber, the collector having a raised edge to prevent the excess solvent from spilling into the coating area;
    removing the excess solvent through a removal line placed in communication with the collector to prevent the excess solvent from dropping on the substrate;
    dispensing the polymer solution over a surface of the substrate while the coating chamber is saturated with the carrier-solvent vapor mixture; and
    rotating the substrate to spread the polymer solution over the surface of the substrate.

16. The method of claim 15 wherein the collector comprises a plurality of grooves.

17. The method of claim 15, further comprising:
  causing a solvent liquid level within the coating chamber to be detected, the solvent liquid being excess solvent that did not get transformed into the solvent vapor; and
  removing the excess solvent by vaporizing the excess solvent.

18. The method of claim 15, wherein generating the carrier-solvent vapor mixture includes:
  introducing the solvent to be transformed into the solvent vapor into a first conduit of a vapor distributor, the vapor distributor including a solvent vapor generator to transform the solvent into the solvent vapor;
  introducing the carrier gas into a second conduit of the vapor distributor;
  vaporizing the solvent to create the solvent vapor;
  mixing the solvent vapor with the carrier gas to create the carrier-solvent vapor mixture; and
  introducing the carrier-solvent vapor mixture into the coating chamber to saturate the coating chamber.

19. The method of claim 18, further comprises coupling a solvent source and a carrier gas source to the vapor distributor.

20. The method of claim 15, further directing the excess solvent removed from the coating chamber into a container.

21. The method of claim 15, wherein removing the excess solvent that did not get transformed into the solvent vapor further comprises,
  introducing the carrier gas into a solvent remover to move the excess solvent into the solvent remover; and
  removing the excess solvent into a container.

22. The method of claim 15, wherein generating the carrier solvent vapor mixture comprises using a device selected from the group consisting of: an atomizer, and an ultrasonic device.

23. The method of claim 15, wherein removing the excess solvent that did not get transformed into the solvent vapor comprises using a device selected from the group consisting of: an atomizer, and an ultrasonic device.

24. The method of claim 15, further comprises evaporating solvent from the polymer solution dispensed on the surface of the substrate to form a polymer layer on the surface of the substrate.

25. The method of claim 24, wherein the polymer solution is a photoresist solution and the polymer layer is a photoresist film.

26. The method of claim 24, wherein the polymer layer comprises a film selected from the group consisting of: an organic planarization film, an anti-reflection film, a siloxane spin-on-glass film, a polyimide film, and a polyimide siloxane film.

27. A method for coating a surface of a substrate with a polymer solution comprising:
  securing a substrate to be coated with a polymer solution in a coating chamber having a rotatable chuck, the rotatable chuck to support the substrate;
  generating a carrier-solvent vapor mixture and saturating the coating chamber with the carrier-solvent vapor mixture, wherein a carrier gas is mixed with a solvent vapor to form the carrier-solvent vapor mixture;
  collecting the excess solvent that did not get transformed into the solvent vapor in a collector above a coating area within the coating chamber, the collector having a raised edge to prevent the excess solvent from spilling into the coating area;
  removing the excess solvent through a removal line placed in communication with the collector to prevent the excess solvent from dropping on the substrate;
  flowing the carrier-solvent vapor mixture into the coating area using a showerhead having a plurality of openings, the showerhead being placed above the coating area within the coating chamber, wherein the carrier-solvent vapor mixture is flown into the coating area through the plurality of openings to saturate the coating area; and
  dispensing the polymer solution over a surface of the substrate while the coating chamber is saturated with the carrier-solvent vapor mixture; and
  rotating the substrate to spread the polymer solution over the surface of the substrate.

28. The method of claim 27, wherein the plurality of openings in the showerhead have sizes ranging from 0.010 µm to 0.085 µm.

29. The method of claim 27, wherein generating the carrier-solvent vapor mixture comprises:
  introducing the solvent to be transformed into the solvent vapor into a first conduit of a vapor distributor, the vapor distributor including a solvent vapor generator to transform the solvent into the solvent vapor;
  introducing the carrier gas into a second conduit of the vapor distributor;
  vaporizing the solvent to create the solvent vapor;
  mixing the solvent vapor with the carrier gas to create the carrier-solvent vapor mixture; and
  introducing the carrier-solvent vapor mixture into the coating chamber to saturate the coating chamber.

30. The method of claim 29, further comprises coupling a solvent source and a carrier gas source to the vapor distributor.

31. The method of claim 27, wherein the polymer solution forms a polymer layer comprising a film selected from the group consisting of: an organic planarization film, an anti-reflection film, a siloxane spin-on-glass film, a polyimide film, and a polyimide siloxane film.

32. The method of claim 27, wherein generating the carrier solvent vapor mixture comprises using a device selected from the group consisting of: an atomizer, and an ultrasonic device.

* * * * *